United States Patent [19]

Wakimoto et al.

[11] Patent Number: 5,745,003
[45] Date of Patent: Apr. 28, 1998

[54] DRIVER CIRCUITS FOR IC TESTER

[75] Inventors: Tsutomu Wakimoto, Kanagawa, Japan; Toshihiro Nomura, Santa Clara, Calif.

[73] Assignee: Schlumberger Technologies Inc., San Jose, Calif.

[21] Appl. No.: 710,032

[22] Filed: Sep. 11, 1996

[51] Int. Cl.$^6$ ..................................... H03K 17/16
[52] U.S. Cl. .................... 327/382; 327/109; 327/382; 327/407; 327/494; 327/496; 327/587; 327/588
[58] Field of Search ........................... 327/108, 109, 327/493, 494, 495, 496, 503, 504, 505, 583, 587, 588, 99, 403, 407, 423, 482

[56] References Cited

U.S. PATENT DOCUMENTS

| | | | |
|---|---|---|---|
| 4,885,545 | 12/1989 | Sanielevici | 327/494 |
| 5,036,219 | 7/1991 | Dingwall et al. | 327/494 |
| 5,276,355 | 1/1994 | Nagata | 327/494 |
| 5,287,022 | 2/1994 | Wilsher et al. | 307/542 |
| 5,430,400 | 7/1995 | Herlein et al. | 327/108 |

*Primary Examiner*—Timothy P. Callahan
*Assistant Examiner*—Jeffrey Zweizig
*Attorney, Agent, or Firm*—Bruce D. Riter

[57] ABSTRACT

A multi-level driver circuit comprises: (a) an output buffer; (b) a first switch for applying a first analog level to the output buffer when in a closed state; (c) a second switch for applying a second analog level to the output buffer when in a closed state; (d) a third switch for applying a third analog level to the output buffer when in a closed state, wherein the third switch applies to the output buffer a capacitance which is dependent upon level when the third switch is in an open state and is unclamped; and (e) a clamping circuit for clamping the third switch such that the third switch applies to the output buffer a capacitance which is substantially independent of the third analog level when the third switch is in an open state and is clamped by the clamping circuit. The switches can be solid-state switches, such as diode bridges. Any number of switches can be provided, and more than one of the switches can be provided with a clamping circuit.

13 Claims, 5 Drawing Sheets

ക5,745,003

DRIVER CIRCUITS FOR IC TESTER

BACKGROUND OF THE INVENTION

1. Field of the Invention

The present invention relates to automatic test systems used in dynamic testing of integrated circuits and, in particular, to driver circuits for use in such systems.

2. The Prior Art

Shown schematically in FIG. 1, the pin electronics circuit 100 of a system for testing digital integrated circuits (IC's) typically has a driver function which can drive a device under test (DUT) with voltage levels Vhigh and Vlow, and a termination function which terminates the input/output (I/O) node with a 50-ohm resistance when a signal is received from the DUT. The termination function has traditionally been achieved by connecting the I/O node 105 to a termination voltage, Vterm, through a switch 110 and a 50-ohm resistor 125. Switch 110 may be a mechanical relay or may be constructed of active devices. In driver mode, switch 110 is turned off (open, as shown) and driver 115 applies levels Vhigh and Vlow to I/O node 105 in accordance with a test program. In termination mode, switch 110 is turned on (closed), and a driver 115 is forced into a high-impedance mode to provide termination capability when the DUT is driving comparator 120.

A disadvantage with the arrangement of FIG. 1 is that closing switch 110 when there is current flow causes a voltage glitch at I/O node 105. Opening switch 110 when there is current flow through termination resistor 125 can likewise produce a voltage overshoot. Operation of switch 110 must therefore be carefully timed to occur when there is no current flow so as to avoid damage to the DUT.

In addition, the propagation delay times of the transitions are mismatched; the transition times from Vhigh-to-Vlow, Vlow-to-Vhigh, Vhigh/low-to-Vterm and Vterm-to-Vhigh/Vlow are different, so that calibrating the transition edges and maintaining edge-placement accuracy are complicated. The transition-time mismatch limits overall system performance, such as the minimum driving-pulse width and the minimum duration of the termination mode. These limitations become more serious as the operating speed of the system is increased.

If switch 110 cannot be operated fast enough for a required test, an alternative is to leave it closed during the test. This may be acceptable if the driver is always driving an output pin of the DUT. But if the DUT pin is an I/O pin which must sometimes be driven and sometimes does the driving, then driver 115 is loaded down by resistor 125. Other problems are then created. For example, the driver amplitude must be twice as large as the signal to be delivered to the DUT to compensate for the load of resistor 125.

Some driver circuits incorporate the termination function in an output stage instead of a switch block. As shown in the driver/termination circuit 200 of FIG. 2, an output buffer 205 is responsive to a DRIVER_OFF signal for selectively switching between driver levels (Vhigh or Vlow) from input buffer 215 and a termination level (Vterm) from input buffer 220. In this example the driver level is switched between Vhigh and Vlow in response to a DRIVER_HI signal. The output of buffer 205 is applied to the I/O node 225 via a resistor 230. This type of driver circuit has many of the disadvantages described above.

FIG. 3 shows a prior-art driver circuit 300 having a termination function implemented in a switch block using diode switches. In this case, one of three levels, termination (Vterm), drive-low (Vlow) and drive-high (Vhigh), is selected by turning on a respective switch. The selected level is then supplied through the output buffer 305, providing the termination function in addition to the driver function. Vterm is selected by closing switch SW1 (with switches SW2 and SW3 open), causing diodes 310 and 315 to become forward-biased by current sources 320 and 325. The voltage drops across the junctions of diodes 310 and 315 cancel out, so the level at node A is Vterm. Vlow is selected by closing switch SW2 (with switches SW1 and SW3 open), causing diodes 330 and 335 to become forward-biased by current sources 320 and 325. The voltage drops across the junctions of diodes 330 and 335 cancel out, so the level at node A is Vlow. Vhigh is selected by closing switch SW3 (with switches SW1 and SW2 open), causing diodes 340 and 345 to become forward-biased by current sources 320 and 325. The voltage drops across the junctions of diodes 340 and 345 cancel out, so the level at node A is Vhigh.

A problem with the circuit of FIG. 3 is that the parasitic capacitance at node A depends on termination level Vterm, because the junction capacitance of diode 315 is voltage dependent. That is, with switch SW1 open, diode 315 acts as a capacitor whose capacitance is dependent on level Vterm. The rise time and propagation delay from Vlow to Vhigh and the fall time and propagation delay from Vhigh to Vlow in driver mode are thus dependent on the level of Vterm. A consequence is that the system must be recalibrated with each change in the level of Vterm, or timing accuracy of the system is degraded.

One solution to the problem of rise/fall time dependency on the level of Vterm is to use operational amplifiers in a feedback loop, as in the prior-art arrangement of FIG. 4 (taken from U.S. Pat. No. 5,430,400 to Herlein et al.). A mux/switch 400 comprises three transconductance differential input stages 410, 420, 430, where each of positive input lines IN1, IN2 and IN3 is connected to receive a corresponding one of the DC input voltage levels, a current-mode switch 440 and a buffer 450. Input node 470 of buffer 450 is high-impedance. Capacitor 480 is the sum of the active device capacitances and wiring capacitances; it is critical in determining the slew rate of the mux/switch and must be minimized. Each time current switch 440 selects a different input, the appropriate input amplifier switched in, being unbalanced, drives current into capacitor 480. The voltage at output node 460 starts changing to reduce the imbalance. After settling, the voltage at output node 460 equals the voltage at the DC input line of the stage whose output is selected by switch 440 (except for voltage offsets). Such an arrangement has the disadvantage that, to be stable, the response time must be slow, producing slow rise/fall times. Fast rise/fall times in such an arrangement lead to oscillations, large overshoot/undershoot and ringing.

SUMMARY OF THE INVENTION

In accordance with preferred embodiments of the invention, a multi-level driver circuit comprises: (a) an output buffer; (b) a first switch for applying a first analog level to the output buffer when in a closed state; (c) a second switch for applying a second analog level to the output buffer when in a closed state; (d) a third switch for applying a third analog signal level to the output buffer when in a closed state, wherein the third switch applies to the output buffer a capacitance which is dependent upon level when the third switch is in an open state and is unclamped; and (e) a clamping circuit for clamping the third switch such that the third switch applies to the output buffer a capacitance which is substantially independent of the third analog signal level

3 when the third switch is in an open state and is clamped by the clamping circuit. The switches can be solid-state switches, such as diode bridges. More than three switches can be provided, and more than one of the switches can be provided with a clamping circuit.

DESCRIPTION OF THE PREFERRED EMBODIMENTS

Figure 1:
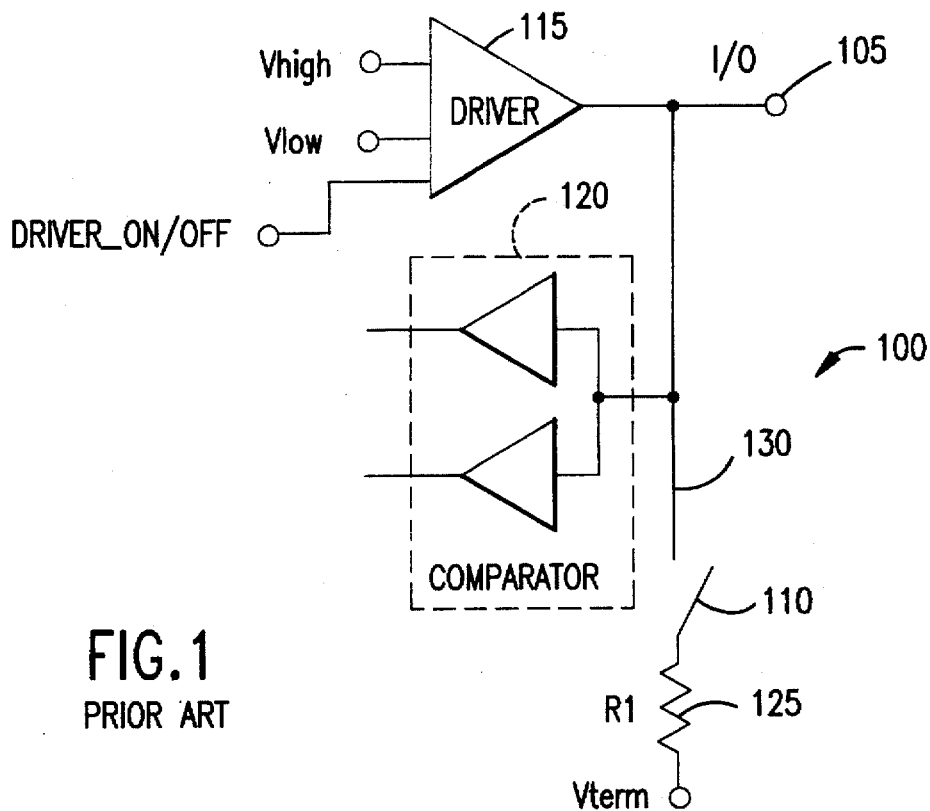
FIG. 1 shows schematically a prior-art pin electronics circuit of a system for testing digital integrated circuits.
Figure 2:
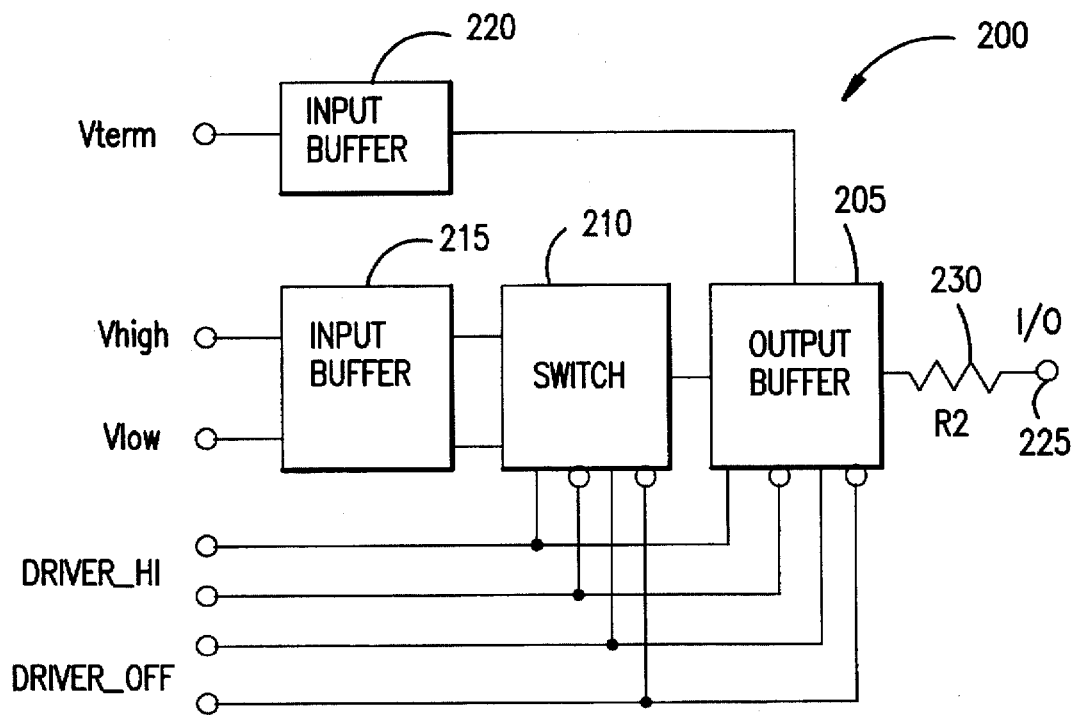
FIG. 2 shows schematically a prior-art driver/termination circuit.
Figure 3:
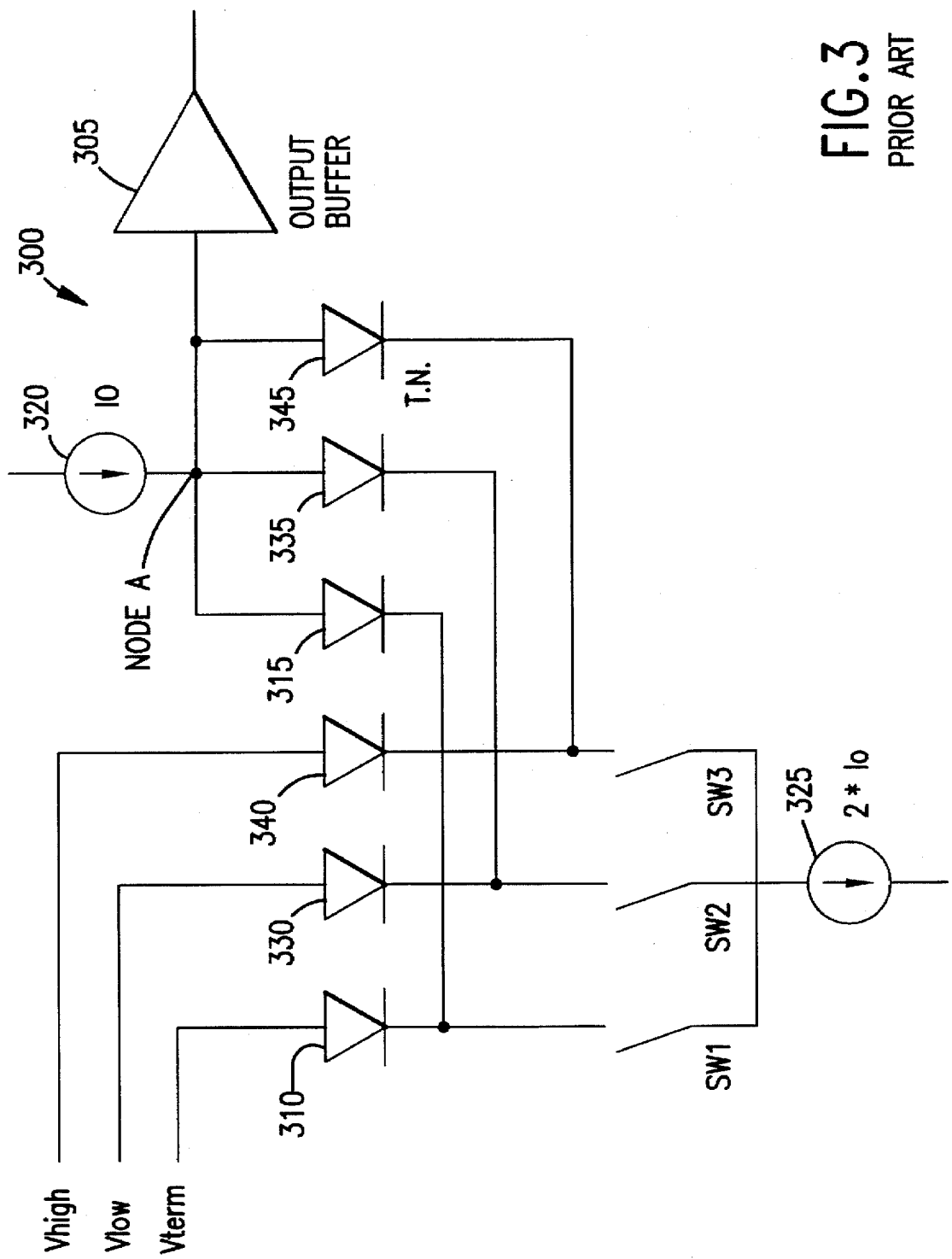
FIG. 3 shows a prior-art driver circuit having a termination function implemented in a switch block using diode switches.
Figure 4:
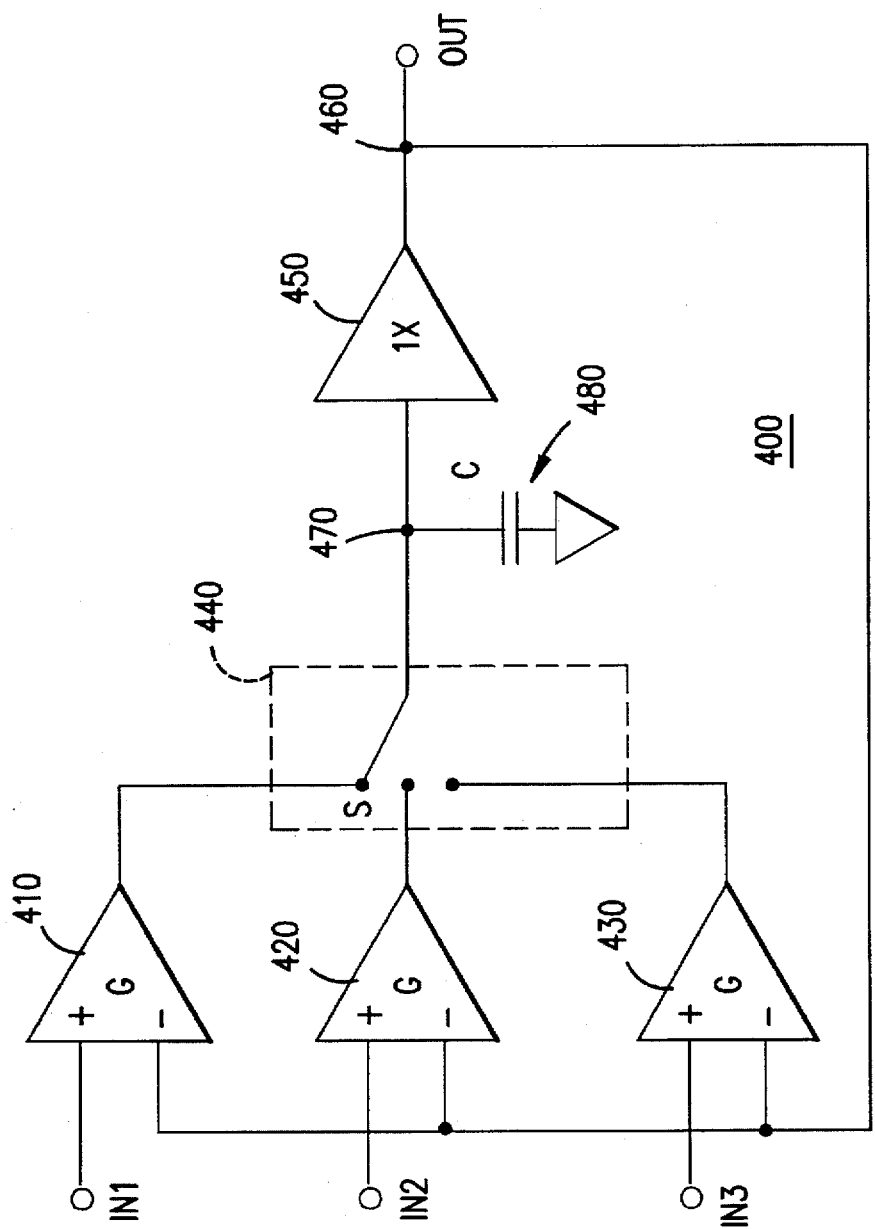
FIG. 4 shows a prior-art mux/switch using operational amplifiers in a feedback loop.
Figure 5:
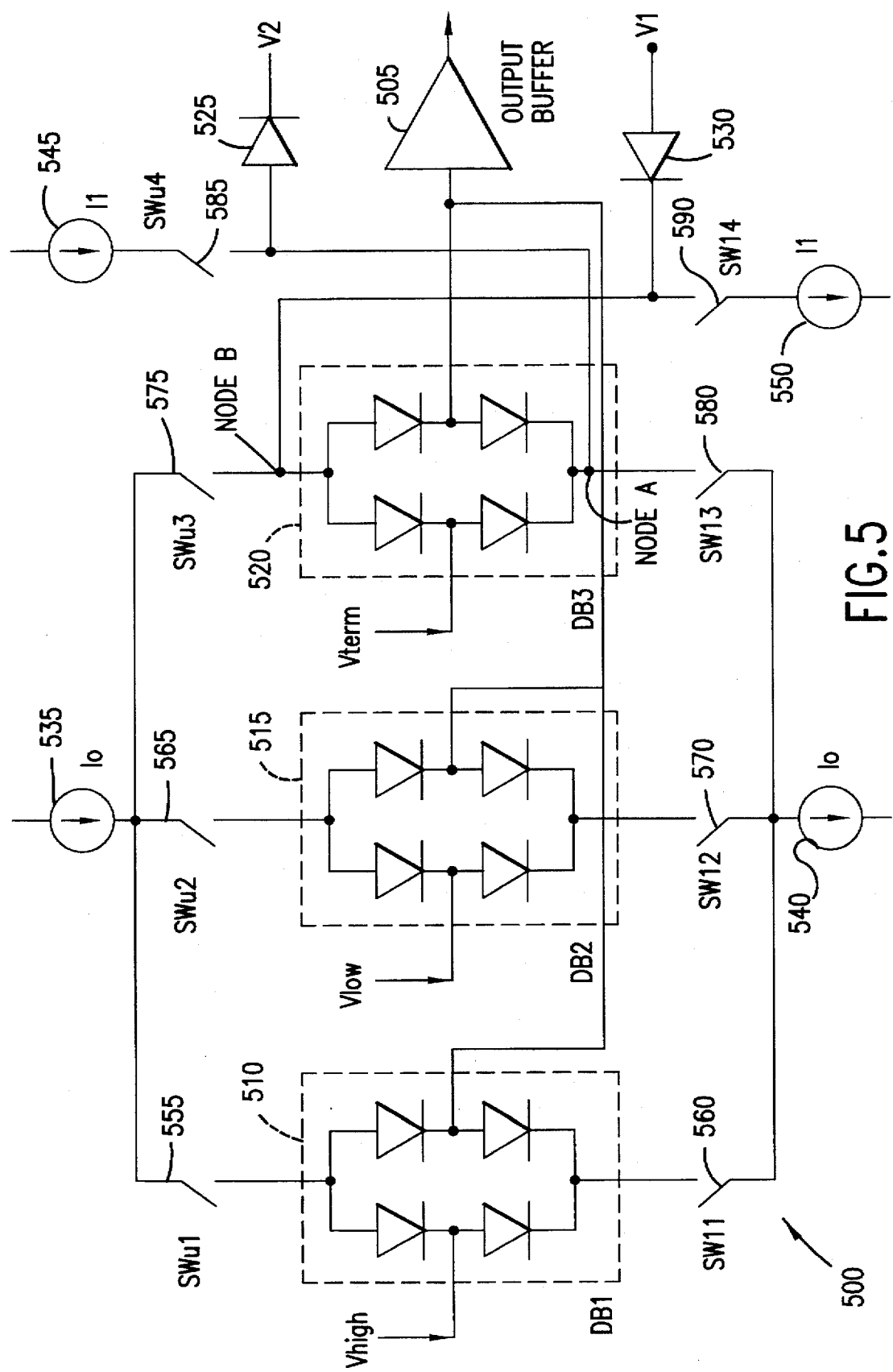
FIG. 5 shows a driver circuit with termination function in accordance with the present invention.

FIG. 5 shows an embodiment of a driver circuit 500 with termination function in accordance with the present invention. Circuit 500 supplies to an output buffer 505 one of three selected input levels: a drive-high level Vhigh; a drive-low level Vlow; and a termination level Vterm. The driver circuit comprises diode bridges 510, 515 and 520, diodes 525 and 530, current sources 535, 540, 545 and 550 and switches 555, 560, 565, 570, 575, 580, 585 and 590. Each switch is controlled with a clock driver in a conventional manner which is not described here.

In operation, the drive high level Vhigh is supplied to buffer 505 by closing switches 555 and 560 to activate diode bridge 510, while switches 565, 570, 575 and 580 remain open to deactivate diode bridges 515 and 520. With switches 555 and 560 closed, current sources 535 and 540 cause the diodes of bridge 510 to be forward-biased. Similarly, the drive-low level Vlow is supplied to buffer 505 by closing switches 565 and 570 to activate diode bridge 515, while switches 555, 560, 575 and 580 remain open. Likewise, termination level Vterm is supplied to buffer 505 by closing switches 575 and 580 to activate diode bridge 520, while switches 555, 560, 565 and 570 remain open.

Diodes 525 and 530 and current sources 545, 550 are used to prevent the rise and fall times of Vhigh and Vlow from being dependent on the value of termination level Vterm. The anode of diode 530 is connected to a reference voltage V1 which is lower than any of levels Vhigh, Vlow and Vterm. The cathode of diode 525 is connected to a reference voltage V2 which is higher than any of levels Vhigh, Vlow and Vterm.

Figure 6:
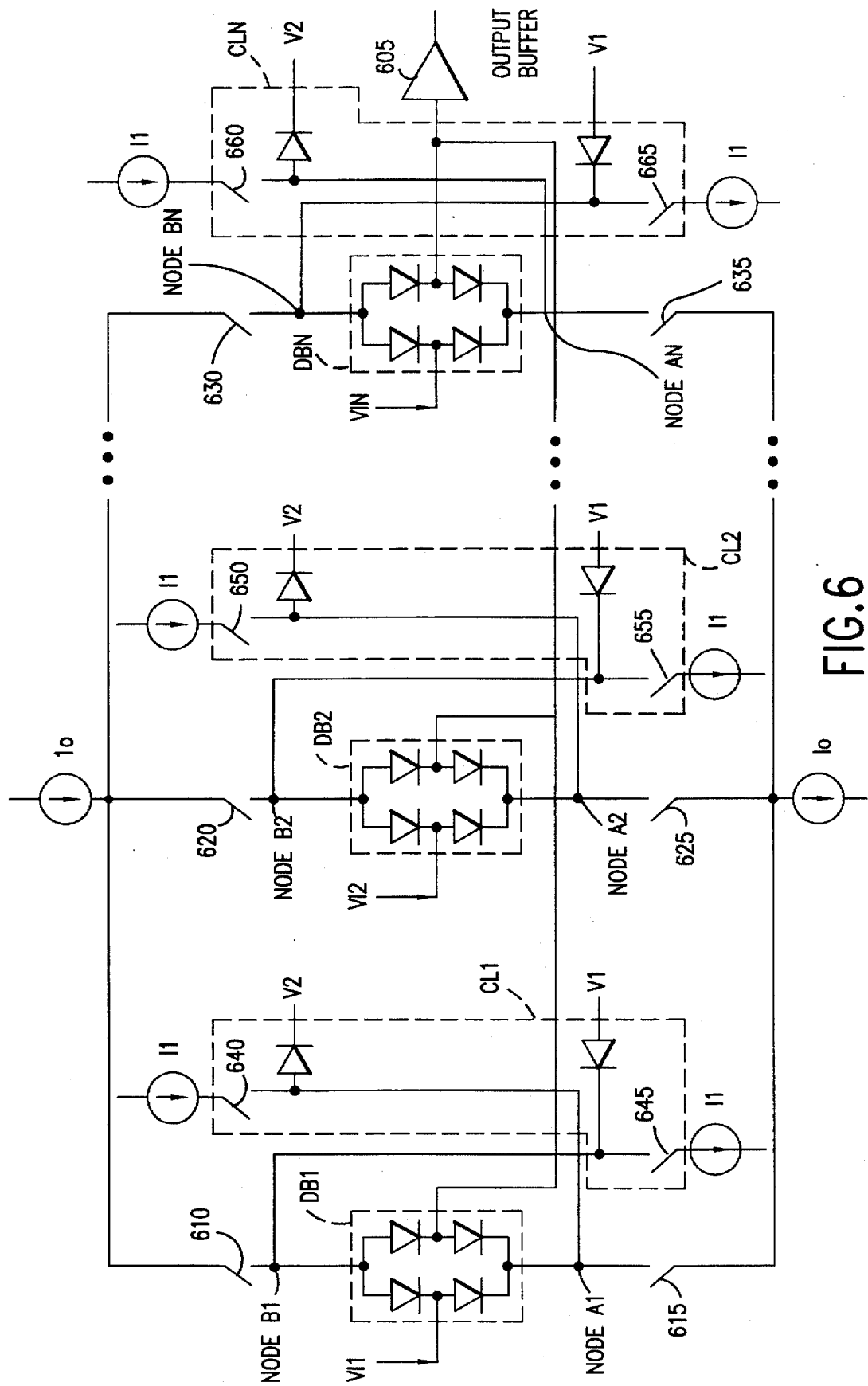
FIG. 6 shows a further driver circuit with termination function in accordance with the present invention.

In a driving mode, where either diode bridge 510 is activated to provide level Vhigh or diode bridge 515 is activated to provide level Vlow, diodes 525 and 530 are also activated (forward-biased) by closing switches 585 and 590. This forces the voltage at node A to a level equal to V2+VD (where VD is the voltage drop across diode 525) and forces the voltage at node B to a level equal to V1−VD (where VD is the voltage drop across diode 530). Fixing the voltages at node A and node B appropriately reverse-biases diode bridge 520 to a fixed level which keeps the capacitance of diode bridge 515 small and fixed. This prevents the termination level, Vterm, from affecting the condition of the rest of the circuit, and thus avoids the rise and fall time dependence on Vterm. In termination mode, when diode bridge 520 is activated, switches 585 and 590 are open so that diode bridge 520 can behave as a switch. FIG. 6 shows a further embodiment of a multi-level driver circuit 600 in accordance with the present invention. Circuit 600 supplies to an output buffer 605 one of N selected input levels: VI1, VI2, ... VIN. The driver circuit comprises a respective diode bridge DB1, DB2, ... DBN for switching each of the input levels, and a respective clamping circuit CL1, CL2, ... CLN for each of the diode bridges. As in the embodiment of FIG. 5, diode bridge DB1 is activated by closing switches 610 and 615, diode bridge DB2 is activated by closing switches 620 and 625, and diode bridge DBN is activated by closing switches 630 and 635. Clamping circuit CL1 is activated by closing switches 640 and 645, clamping circuit CL2 is activated by closing switches 650 and 655, and clamping circuit CLN is activated by closing switches 660 and 665. Each of switches 610–665 is controlled with a clock driver in a conventional manner which is not described here.

In operation, level VI1 is supplied to buffer 605 by closing switches 610 and 615 to activate (forward-bias) diode bridge DB1, while the other diode bridges DB2–DBN are deactivated. Similarly, level VI2 is supplied to buffer 605 by closing switches 620 and 625 to activate diode bridge DB2, while the other diode bridges are deactivated. Level VIN i supplied to buffer 605 by closing switches 630 and 635 to activate diode bridge DBN, while the other diode bridges are deactivated.

Clamping circuits are activated when the associated diode bridges are deactivated, and vice versa. For example, when diode bridge DB1 is activated, diode bridges DB2–DBN are deactivated and clamping circuits CL2–CLN are activated to assure that capacitances of diode bridges DB2–DBN are small and fixed. As in the embodiment of FIG. 5, each clamping circuit has the anode of one diode connected to a reference voltage V1 which is lower than any of levels VI1–VIN. The cathode of the other clamping circuit diode is connected to a reference voltage V2 which is higher than any of levels VI1–VIN. With a clamping circuit CLn active, nodes An and Bn are forced to levels which assure reverse-biasing of the corresponding diode bridge DBn at an appropriate level.

Those of skill in the art will recognize that driver circuits in accordance with the invention can avoid dependence on one level (e.g., termination level) of rise and fall times between other levels (e.g., driving-mode levels), minimize mismatch of propagation delay times in transitions between levels, and minimize voltage glitches (overshoots and undershoots) during transitions between levels.

Those of skill in the art will also recognize that the embodiments shown and described above are merely illustrative of the invention and can be modified in a variety of ways without departing from the spirit and scope of the invention as defined by the following claims. For example, the embodiment of FIG. 5 provides a clamping circuit only for the termination diode bridge 520, while the embodiment of FIG. 6 provides a clamping circuit CLn for each of the diode bridges; it will be recognized that such a clamping circuit can be provided for more than one but less than all of the diode bridges as the need may dictate.

We claim:

1. A three-level driver circuit, comprising:

a. an output buffer
   b. a first switch for applying a first analog level to the output buffer when in a closed state;

c. a second switch for applying a second analog level to the output buffer when in a closed state;

d. a third switch for applying a third analog level to the output buffer when in a closed state, wherein the third switch applies to the output buffer a capacitance which is dependent upon the third analog level when the third switch is in an open state and is unclamped; and e. a clamping circuit for clamping the third switch such that the third switch applies to the output buffer a capacitance which is substantially independent of the third analog level when the third switch is in an open state and is clamped by the clamping circuit.

2. The driver circuit of claim 1, wherein the third switch is a solid-state switch and wherein the clamping circuit forces the third switch to a reverse-biased condition when third switch is open.

3. The driver circuit of claim 1, wherein the clamping circuit drives to a known value the capacitance applied to the output buffer by the third switch when the third switch is open.

4. The driver circuit of claim 1, wherein the switched clamping circuit applies at least one clamping voltage to the third switch to thereby drive to a known value the capacitance applied to the output buffer by the third switch when the third switch is open.

5. A multi-level driver circuit, comprising:

a. an output buffer b. a plurality N of switches each of which applies a respective analog level to the output buffer when in a closed state, wherein at least one switch applies an analog level to the output buffer when in a closed state and applies to the output buffer a capacitance which is dependent upon level when in an unclamped, open state; and c. a clamping circuit for clamping said at least one switch such that said at least one switch applies to the output buffer a capacitance which is substantially independent of analog level when said at least one switch is in an open state and is clamped by the clamping circuit.

6. The driver circuit of claim 5, wherein said at least one switch is a solid-state switch and wherein the clamping circuit forces said at least one switch to a reverse-biased condition when said at least one switch is in an open state.

7. The driver circuit of claim 5, wherein the switched clamping circuit drives to a known value the capacitance applied to the output buffer by said at least one switch when said at least one switch is in an open state.

8. The driver circuit of claim 5, wherein the switched clamping circuit applies at least one clamping voltage to said at least one switch to thereby drive to a known value the capacitance applied to the output buffer by said at least one switch when said at least one switch is open.

9. A multi-level driver circuit, comprising:

a. an output buffer b. a plurality of switches, each switch having an open state and a closed state, each switch applying a respective analog level to the output buffer when in a closed state, and each switch applying a capacitance which is dependent upon the respective analog level when in an unclamped, open state; and c. a plurality of clamping circuits, each clamping circuit serving to clamp a respective one of switches such that when a switch is in an open state it applies to the output buffer a capacitance which is substantially independent of analog level.

10. The driver circuit of claim 9, wherein each of switches is a solid-state switch which, when in an open state, is forced by a respective clamping circuit to a reverse-biased condition.

11. The driver circuit of claim 9, wherein the capacitance applied to the output buffer by each switch, when in an open state, is driven to a known value by the clamping circuit.

12. The driver circuit of claim 9, wherein the capacitance applied to the output buffer by each of switches, when in an open state, is driven to a known value by the application of at least one clamping voltage from a respective one of clamping circuits.

13. A method of operating a multi-level driver circuit having a plurality of switches, each switch applying a respective analog level to an output buffer when in a closed state, and each switch applying to the output buffer a capacitance which is dependent upon the respective analog level when in an unclamped, open state, comprising:

a. clamping each of switches when in an open state so as to present to the output buffer a capacitance which is substantially independent of analog level; and b. unclamping each of switches when in a closed state so as to apply to the output buffer a respective analog level.

* * * * *